United States Patent
Chen et al.

(10) Patent No.: US 6,713,781 B1
(45) Date of Patent: Mar. 30, 2004

(54) ORGANIC LIGHT-EMITTING DEVICE HAVING PHENANTHROLINE-FUSED PHENAZINE

(75) Inventors: Jian Ping Chen, San Jose, CA (US); Xiao-Chang Charles Li, Union City, CA (US)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/309,065

(22) Filed: Dec. 4, 2002

(51) Int. Cl.$^7$ ................................................ H01L 51/00
(52) U.S. Cl. ...................... 257/40; 257/103; 313/506; 428/917
(58) Field of Search .................. 257/40, 103; 438/99; 313/502, 506; 428/690, 917

(56) References Cited

U.S. PATENT DOCUMENTS

| | | | |
|---|---|---|---|
| 4,772,563 A | 9/1988 | Evangelista et al. | 436/518 |
| 5,393,614 A | 2/1995 | Nakada | 428/690 |
| 5,645,948 A | 7/1997 | Shi et al. | 428/690 |
| 5,792,567 A | 8/1998 | Kido et al. | 428/690 |
| 5,904,994 A | 5/1999 | Dodabalapur et al. | 428/690 |
| 6,010,796 A | 1/2000 | Kijima | 428/690 |
| 6,013,384 A | 1/2000 | Kido et al. | 428/690 |
| 6,288,229 B1 | 9/2001 | Komatsuzaki et al. | 544/225 |
| 6,524,728 B1 * | 2/2003 | Kijima et al. | 428/690 |

FOREIGN PATENT DOCUMENTS

| | | |
|---|---|---|
| JP | 2001-267080 | 9/2001 |
| WO | 00/70655 | 11/2000 |

OTHER PUBLICATIONS

"Synthesis and Study of a Mixed–ligand Ruthenium(ii) Complex in Its Ground and Excited States", Amouyal, et al., Journal Of The Chemical Society, Dalton Transactions, Inorganic Chemistry, (1990), No. 5, pp. 1841–1845.

"Mononuclear and Binuclear Tetrapyrido [3,2–a:2',3'–c:3",2"–h:2"',3"'–j]phenazine (tpphz) Ruthenium and Osmium Complexes", Bolger, et al., Inorganic Chemistry (1996), vol. 35, No. 10, pp 2937–2944.

"Stepwise Syntheses of Mono– and Di–nuclear Ruthenium tpphz Complexes", Bolger, et al., Journal Of The Chemical Society, Chemical Communications (1995), No. 17, pp. 1799–1800.

"Superradiant properties of 4,4'–bis(1H–phenanthro[9,10–d]imidazol–2–yl)biphenyl and how a laser dye with exceptional stability can be obtained in only one synthetic step", Krebs, et al., Tetrahedron Letters 42 (2001), pp. 6753–6757.

"Design and Application of Electron–Transporting Organic Materials", Strukelj, et al., Science (1995), vol. 267, pp. 1969–1972.

"High electron mobility in bathophenanthroline", Naka, et al., Applied Physics Letters (2000), vol. 76, No. 2, pp. 197–199.

"Introduction of Benzo[h]quinoline and 1,10–Phenanthroline Subunits by Friedländer Methodology", Riesgo, et al., Journal of Organic Chemistry (1996), vol. 61, No. 9, pp. 3017–3022.

* cited by examiner

*Primary Examiner*—Sara Crane
(74) *Attorney, Agent, or Firm*—Fitzpatrick, Cella, Harper & Scinto

(57) ABSTRACT

An organic light-emitting device (OLED) in which a phenanthroline-fused phenazine based compound is used an emissive layer, an electron transport layer, a hole-blocking layer, and/or a host material for a functional dopant.

29 Claims, 4 Drawing Sheets

| |
|---|
| 6 |
| 5 |
| 4 |
| 3 |
| 2 |
| 1 |

ORGANIC LIGHT-EMITTING DEVICE HAVING PHENANTHROLINE-FUSED PHENAZINE

BACKGROUND OF THE INVENTION

1. Field of the Invention

The present invention relates to an organic light emitting device (OLED) in which a phenanthroline-fused phenazine or its derivative is used as an emissive layer, an electron transport layer, a hole-blocking layer, and/or a host material.

2. Description of the Related Art

OLEDs are commercially attractive for various display applications due to their high efficiency, low driving voltage, wide color range, light weight, simple device fabrication and potential low cost. Great efforts have been made to develop effective materials for use in these devices.

OLEDs typically comprise an emissive layer sandwiched between a transparent anode, such as transparent indium tin oxide (ITO), and a metal cathode, such as Mg, Al, Ag or their alloys. When a bias is applied across the electrodes, holes and electrons are respectively injected from the anode and cathode into the emissive layer, typically facilitated by hole transport and electron transport layers adjacent to the respective electrodes. The holes and electrons radiatively combine in the emissive layer and emit light.

In many cases, the doping of a functional material into a host material may lead to improved performance. Improved performance also may be achieved through the utilization of blocking layers, which block either holes or electrons from escaping the device.

Because of consumer expectations of good efficiency, long lifetime and pure color for OLEDs, a need exists for the development of effective materials for use in these devices.

SUMMARY OF THE INVENTION

It is an object of the invention to provide an improved OLED in which phenanthroline-fused phenazine or its derivative is used as an emissive layer, an electron transport layer, a hole-blocking layer, and/or a host material for a functional dopant.

Thus, in one aspect, the invention is an OLED in which an organic layer is sandwiched between an anode and a cathode, and in which the organic layer includes a phenanthroline-fused phenazine based compound.

In one embodiment of the invention, the phenanthroline-fused phenazine based compound is 1,10-phenanthroline-fused phenazine with the following structure:

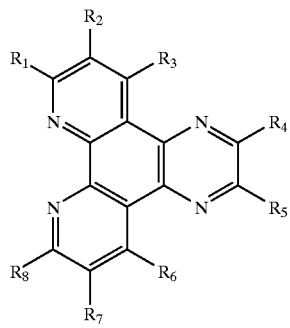

wherein $R_1$ to $R_8$ independently represent H, an alkyl group, an alkoxy group, or an aromatic group.

In another embodiment of the invention, the phenanthroline-fused phenazine based compound is 1,7-phenanthroline-fused phenazine with the following structure:

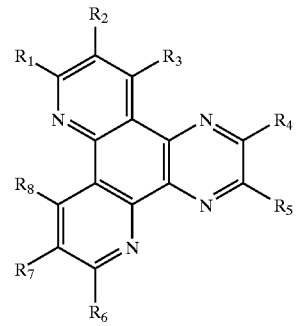

wherein $R_1$ to $R_8$ independently represent H, an alkyl group, an alkoxy group, or an aromatic group.

In another embodiment of the invention, the phenanthroline-fused phenazine based compound is a 4,7-phenanthroline-fused phenazine with the following structure:

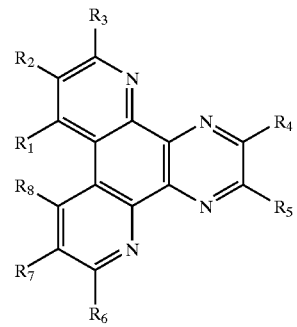

wherein $R_1$ to $R_8$ independently represent H, an alkyl group, an alkoxy group, or an aromatic group.

In another embodiment of the invention, the phenanthroline-fused phenazine based compound is 1,10-phenanthroline-fused phenazine of the following structure:

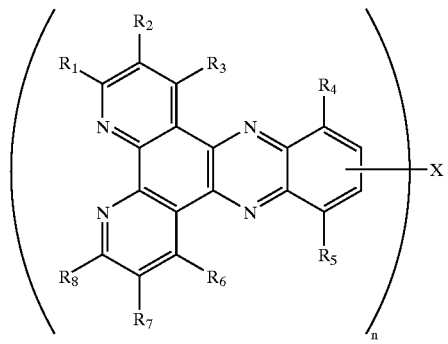

wherein $R_1$ to $R_8$ independently represent H, an alkyl group, an alkoxy group, or an aromatic group; X represents O, S, NR, with R being H or an alkyl group, $CH_2$, $CH_2CH_2$, or a fused or substituted aromatic group; and n is an integer from 1 to 12, wherein X may not be present when n is 1.

In another embodiment of the invention, the phenanthroline-fused phenazine based compound is 1,7 phenanthroline of the following structure:

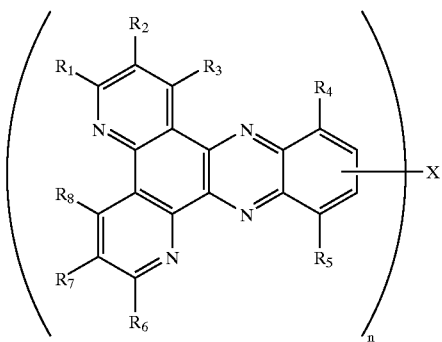

wherein $R_1$ to $R_8$ independently represent H, an alkyl group, an alkoxy group, or an aromatic group; X represents O, S, NR, with R being H or an alkyl group, $CH_2$, $CH_2CH_2$, or a fused or substituted aromatic group; and n is an integer from 1 to 12, wherein X may not be present when n is 1.

In another embodiment of the invention, the phenanthroline-fused phenazine is 4,7-phenanthroline-fused phenazine with the following structure:

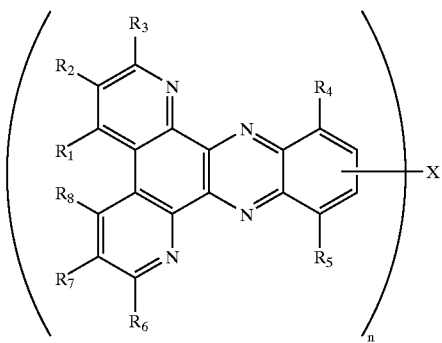

wherein $R_1$ to $R_8$ independently represent H, an alkyl group, an alkoxy group, or an aromatic group; X represents O, S, NR, with R being H or an alkyl group, CH2, CH2CH2, or a fused or substituted aromatic group; and n is an integer from 1 to 12, wherein X may not be present when n is 1.

Some preferred phenanthroline-fused phenazine based compounds are listed below:

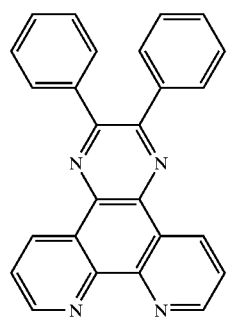 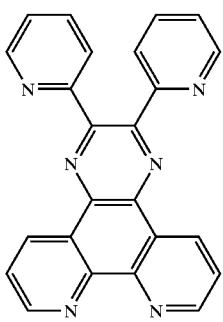 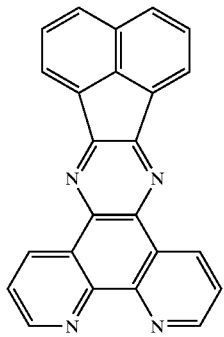 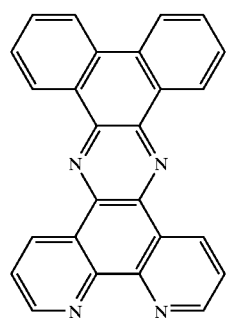

-continued

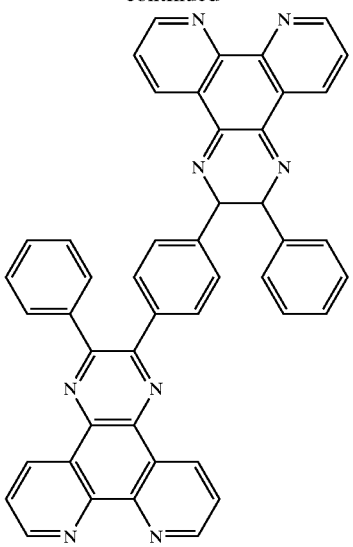

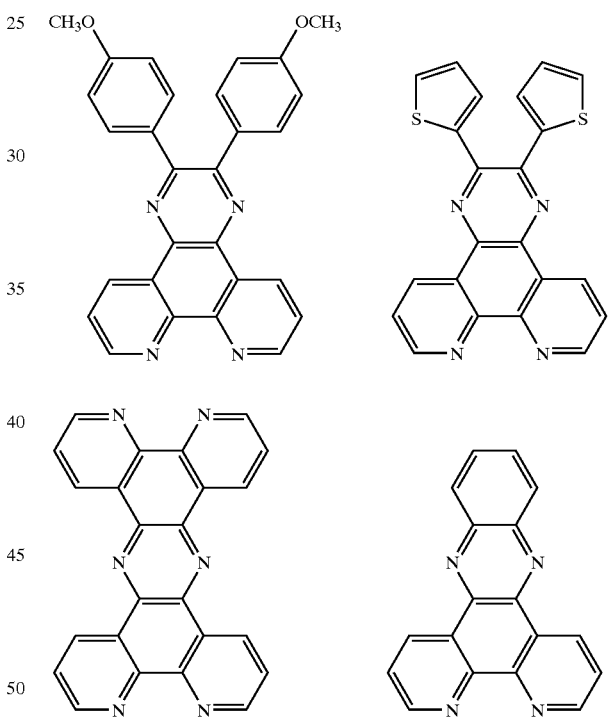

-continued

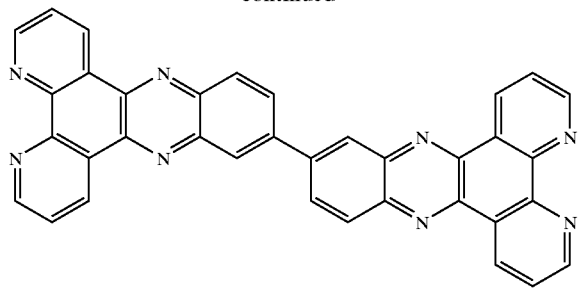

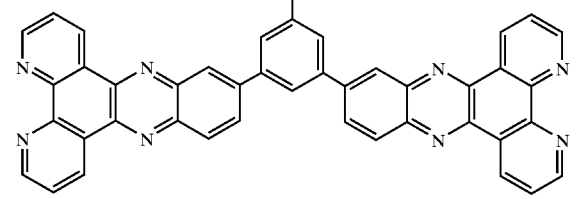

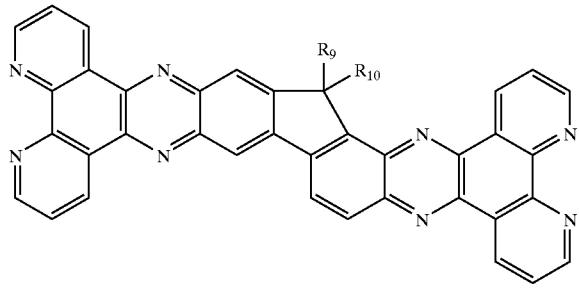

wherein $R_9$ and $R_{10}$ independently are H, $CH_3$ or another alkyl group;

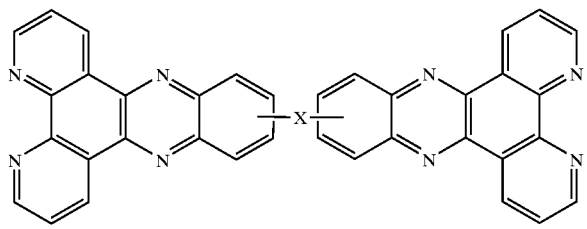

wherein X is O, S, NR, with R being H, $CH_3$ or another alkyl group, $CH_2$ or $CH_2CH_2$.

1,7 phenanthroline-fused phenazine or 4,7 phenanthroline-fused phenazine may be substituted for 1,10 phenanthroline-fused phenazine in the above-listed structures.

According to the invention, the phenanthroline-fused phenazine based compound can be used as an emissive layer, a hole blocking layer, and/or an electron transport layer. Further, the compound can be used as a host material for a functional guest material. The functional guest material may be an emitter, a hole-blocker, and/or an electron transporter.

The phenanthroline-fused phenazine based compound can be used in both electro-fluorescent and electro-phosphorescent OLEDs.

This brief summary has been provided so that the nature of the invention may be understood quickly. A more complete understanding of the invention can be obtained by reference to the following detailed description of the preferred embodiments thereof in connection with the attached drawings.

DETAILED DESCRIPTION OF INVENTION

Accordingly, the present invention provides for the utilization of a phenanthroline-fused phenazine based compound in a functional layer of an OLED. Phenanthroline-fused phenazine based compounds may exhibit excellent emitting, electron-transporting, and/or hole-blocking abilities. In addition, a phenanthroline-fused phenazine based material acting as a host for a functional material may lead to increased performance of an OLED.

Figure 1:
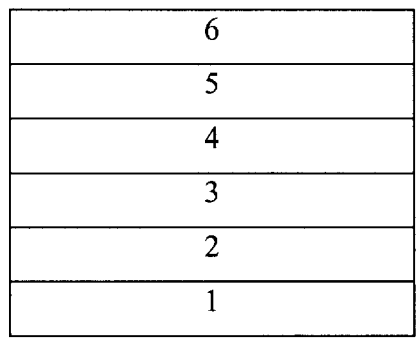
FIG. 1 is a schematic cross-sectional view of an OLED according to the invention.

FIG. 1 schematically depicts an OLED according to the invention, including transparent substrate 1, anode 2 adjacent the substrate, hole transport layer 3 adjacent the anode, emissive layer 4, electron transport layer 5, and cathode 6. Each of these layers may itself comprise multiple layers of material having similar composition or function.

Suitable materials for substrate 1 include glass, quartz and the like, and polymers (including, without limitation, polyesters, polycarbonates, polyacrylates, polymethacrylates, and polysulfones). The thickness of the substrate is not critical and can range, for example, from about 25 to over 1,000 microns, depending on the structural demands of the device.

The anode 2 adjacent the substrate can be comprised of a metal, an alloy, an electroconducting compound, or mixtures thereof, especially with a work function equal to, or greater than about 4 electron volts. Specific examples of anodes include positive charge injecting electrodes such as indium tin oxide (ITO), tin oxide, zinc oxide, gold, platinum, electrically conductive carbon, and conjugated polymers such as polyaniline, polypyrrole, and the like. ITO is preferred. The thickness of the anode can range anywhere from about 10 nanometers to 1 micron.

The hole injecting layer 3 (also referred to herein as a hole transport layer) may be comprised of any material which can inject and transport holes into the emissive layer. Preferably, the thickness of the hole injecting layer is approximately 20 nanometers. A preferred hole injecting and hole transporting material is 4,4'-bis[N-(1-naphthyl-1)-N-phenyl-amino]-biphenyl (NPB), having the following structure:

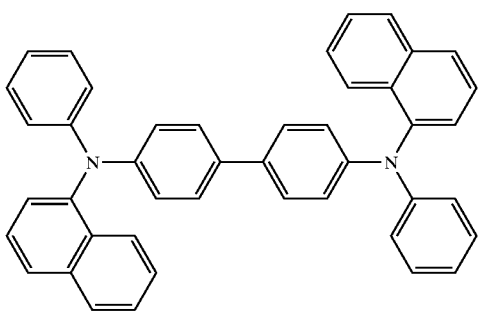

NPB: 4,4'-bis[N-(1-naphthyl-1)-N-phenyl-amino]-biphenyl

The emissive layer 4 may be a guest-host system or deposited neat. Preferably, the thickness of the emissive layer ranges from about 10 to 40 nanometers. One suitable emissive material which may be used in the present invention is aluminum tris(8-hydroxyquinoline) (AlQ$_3$), having the following structure:

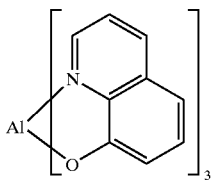

AlQ$_3$: aluminum tris(8-hydroxyquinoline)

The electron transport layer 5 comprises an electron transport material. Given that electron transport capability also can be incorporated into the emissive layer, the electron transport layer is optional. The electron transport layer may act as a hole blocking layer. A hole blocking layer has a band gap energy greater than the energy of the excitons produced in the emission layer, such that the excitons cannot exist in the blocking layer. A hole blocking layer separate from the electron transport layer 5 also may be provided. For example, a hole blocking layer may be provided between emission layer 4 and electron transport layer 5. Usually, the thickness of the electron transport layer 5 ranges from about 20 to 40 nanometers.

The cathode 6 can be comprised of any metal, including high or low work function metals. Aluminum, lithium, magnesium and calcium are particularly preferred.

In a generalized procedure for fabricating an OLED, a clean transparent substrate 1 having an anode 2 patterned thereon is treated with O$_2$ plasma for 1 to 5 minutes. Then the substrate 1 having the anode layer 2 patterned thereon is placed in a vacuum deposition chamber and the pressure is reduced to 6×10$^{-6}$ torr. The various layers 3 to 6 are deposited by vacuum deposition, after which the vacuum deposition chamber is allowed to cool.

Various phenanthroline-fused phenazine based compounds have been prepared to investigate their suitability for use in OLEDs.

EXAMPLE 1

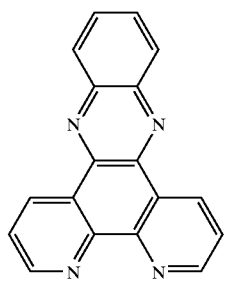

(A)

Figure 2:
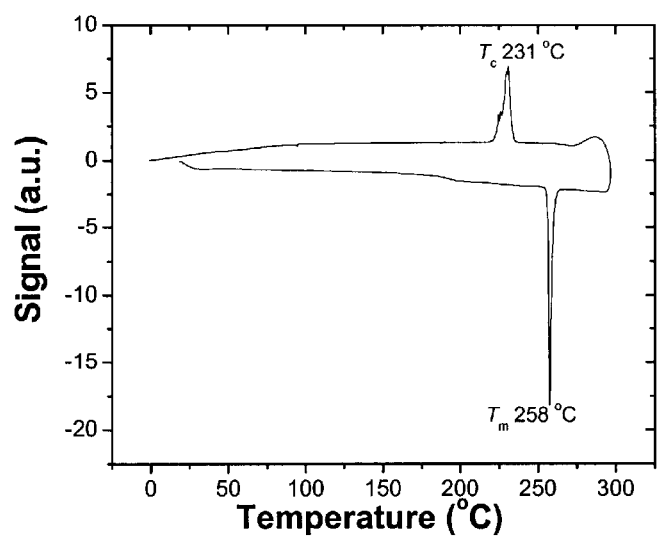
FIGS. 2, 4 and 6 illustrate differential scanning calorimetry (DSC) scans of various phenanthroline-fused phenazine compounds within the scope of the invention.
Figure 3:
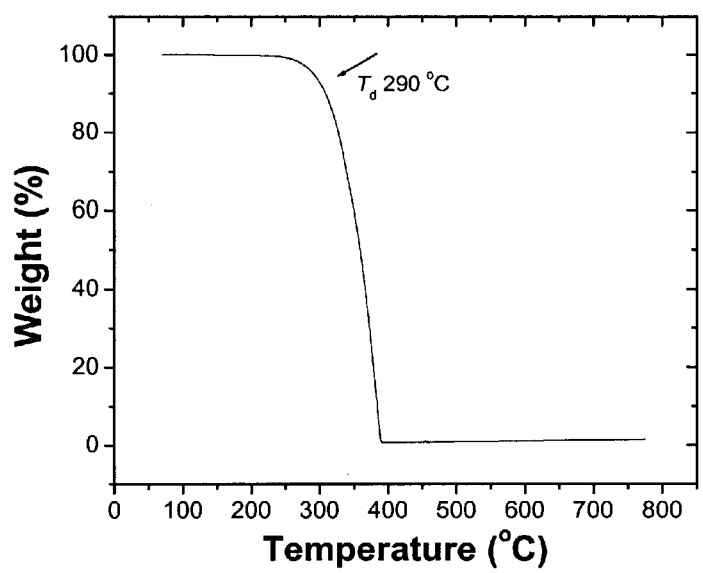
FIGS. 3, 5 and 7 illustrate thermogravimetric analysis (TGA) scans of various phenanthroline-fused phenazine based compounds within the scope of the invention.

Compound (A) was synthesized according to the procedures referenced in Journal of Chemical Society, Dalton Trans. 1990, 1841–845. A DSC scan of the compound showed a melting point of 258° C. The results of the DSC scan are shown in FIG. 2. A TGA scan of the compound showed a crystallization temperature of 231° C. The results of the TGA scan are shown in FIG. 3. Compound (A) can be fabricated into an OLED using the above generalized procedure.

EXAMPLE 2

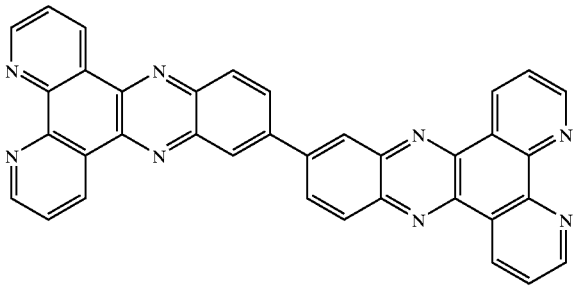

(B)

Figure 4:
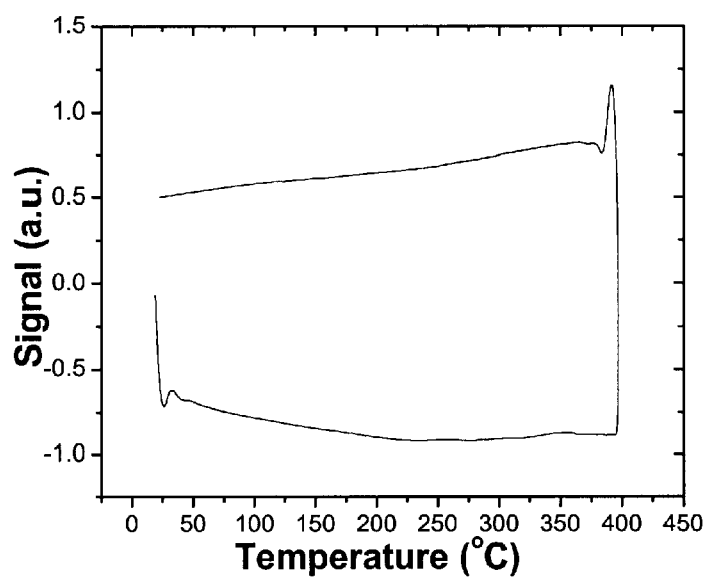
Figure 5:
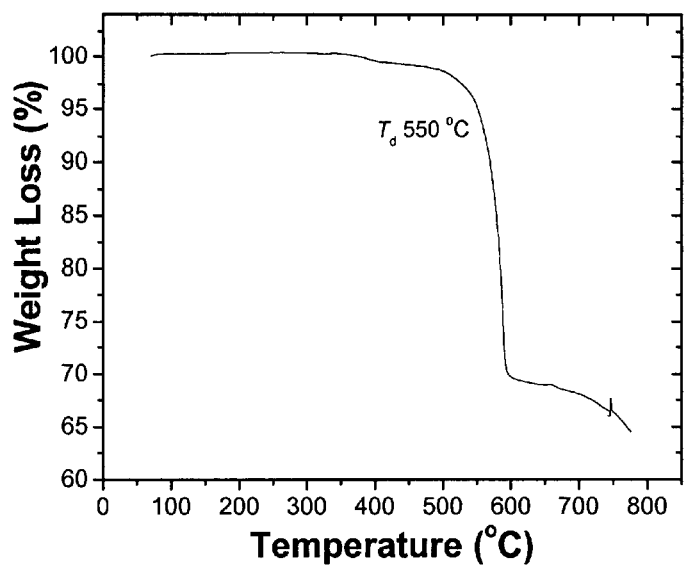

3,3'-diaminobenzidine (0.428 g, 2 mmol), 1,10-phenanthroline-5,6-dione (0.84 g, 4 mmol), and anhydrous DMF (30 mL) were added to a round flask. The mixture was refluxed under N$_2$ for 5 days. After cooling down, the reaction mixture was poured into a large amount of methanol. Compound (B), shown above, precipitated from the solvent, and was filtrated, washed with warm methanol, and dried under vacuum. A yield of 1.0 g (90%) of compound (B) was obtained. A DSC scan of compound (B), in which compound (B) was heated to 400° C., did not show a melting point. The results of the DSC scan of compound (B) are illustrated in FIG. 4. A TGA scan of compound (B) was also performed. The TGA scan indicated a high thermal decomposition temperature of 550° C. The results of the TGA scan of compound (B) are illustrated in FIG. 5. Compound (B)

can be fabricated into an OLED using the above generalized procedure.

EXAMPLE 3

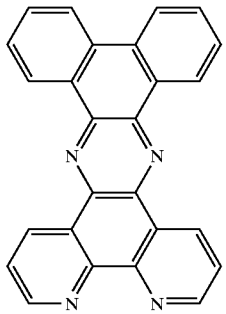

(C)

Figure 6:
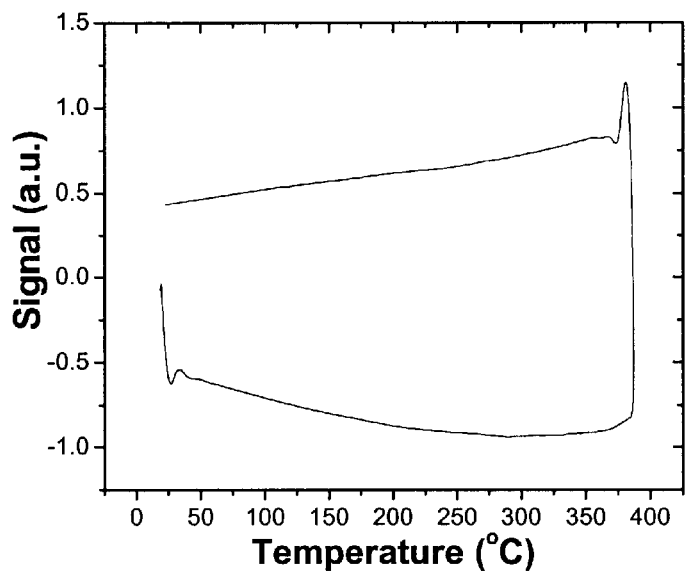
Figure 7:
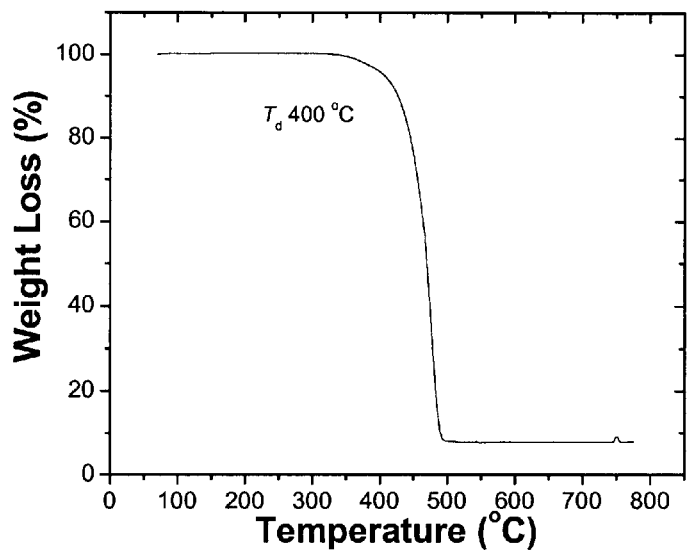

9,10-diaminophenanthrene (0.42 g, 2 mmol), 1,10-phenanthroline-5,6-dione (0.428 g, 2 mmol), and anhydrous DMF (20 mL) were added to a round flask. The mixture was refluxed under $N_2$ for 5 days. After cooling down, the reaction mixture was poured into a large amount of methanol. Compound (C), shown above, precipitated from the solvent and was filtrated, washed with warm methanol, and dried under vacuum. A yield of 0.6 g (74%) of compound (C) was obtained. A DSC scan of this compound, in which the compound was heated to 380° C., did not show a melting point. The results of the DSC scan are shown in FIG. 6. A TGA scan was also performed, indicating a thermal decomposition temperature of 400° C. The results of the TGA scan of compound (C) are illustrated in FIG. 7. Compound (C) can be fabricated into an OLED using the above generalized procedure.

EXAMPLE 4

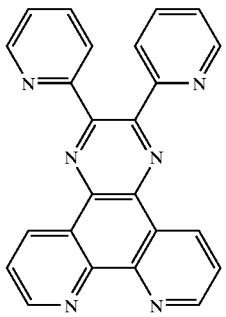

(D)

Figure 8:
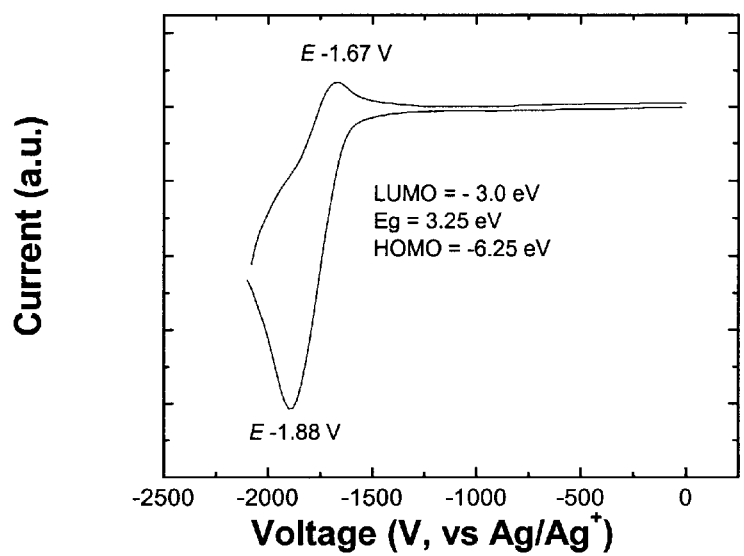
FIG. 8 illustrates a cyclic voltammetry (CV) scan of a phenanthroline-fused phenazine based compound within the scope of the invention.

5,6-diamino-1,10-phenanthroline (0.28 g, 1.3 mmol), 2,2'-pyridil (0.28 g., 1.3 mmol), and anhydrous DMF (20 mL) were added to a round flask. The mixture was refluxed under $N_2$ for 2 days. After cooling down, compound (D), shown above, precipitated and was filtrated, washed with warm methanol, and dried under vacuum. The yield of compound (D) was 0.30 g (59%). A DSC scan of the compound, in which the compound was heated to 300° C., did not indicate a melting point. The compound has a high thermal decomposition temperature of 340° C. The compound shows a green emission in the solid state. The compound was characterized by cyclic voltammetric analysis. The results of the cyclic voltammetric analysis are provided in FIG. 8. The compound has a LUMO of −3.0 eV, a HOMO of −6.25 eV, and an Eg of 3.25 eV. Compound (D) can be fabricated into an OLED using the above generalized procedure.

EXAMPLE 5

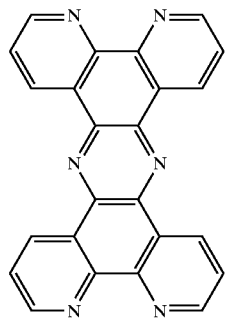

(E)

This compound was synthesized from 5,6-diamino-1,10-phenanthroline and 5,6-dione-1,10-phenanthroline according to the procedures referenced in Journal of Chemistry Society, Dalton Trans. 1995, 1799–1780, and Inorganic Chemistry, 1996, 2937–2944. A DSC scan of this compound, in which the compound was heated to 400° C., did not indicate a melting point. The compound has a high thermal decomposition temperature of 445° C. Compound (E) can be fabricated into an OLED using the above generalized procedure.

EXAMPLE 6

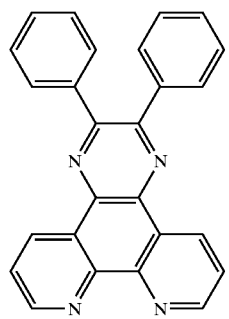

(F)

Compound (F) was synthesized from 5,6-diamino-1,10-phenanthroline and benzil in a similar way as that described above for compound (D). A DSC scan of compound (F), in which the compound was heated to 300° C., did not indicate a melting point. The compound has a high thermal decomposition temperature of 325° C. The compound shows a green emission in the solid state. It has a PL emission peak at 410° C. in THF. Compound (F) can be fabricated into an OLED using the above generalized procedure.

EXAMPLE 7

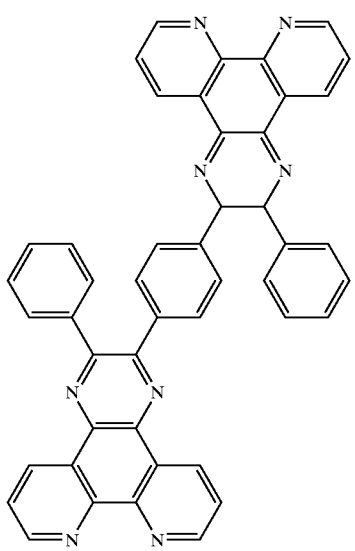

(G)

Compound (G) was synthesized from 5,6-diamino-1,10-phenanthroline and 1,4-bisbenzil in a similar way as described above for compound (D). A DSC scan of this compound, in which the compound was heated to 400° C., did not indicate a melting point. Compound (G) has a high thermal decomposition temperature of 495° C. The compound shows a blue-green emission in the solid state. Compound (G) can be fabricated into an OLED device using the above procedure.

EXAMPLE 8

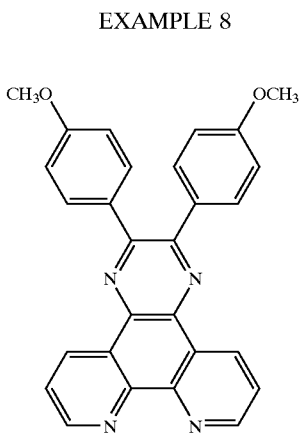

(H)

Compound (H) was synthesized from 5,6-diamino-1,10-phenanthroline and 4,4'-dimethoxybenzil in a similar way as described above for compound (D). Compound (H) shows a melting point of 310° C. on a DSC scan. It has a thermal decomposition temperature of 325° C. The compound shows a blue-green emission in the solid state. It has a PL emission peak at 460 in THF, a HOMO of −5.9 eV, and a LUMO of −3.1 eV. Compound (H) can be fabricated into an OLED using the above generalized procedure.

EXAMPLE 9

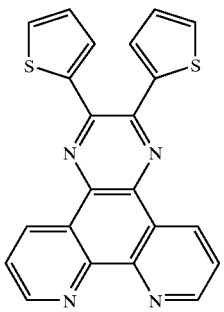

(I)

Compound (I) was synthesized from 5,6-diamino-1,10-phenanthroline and 2,2'-thenil in a similar way as described above for compound (D). This compound showed a melting point of 283° C. on a DSC scan. It has a thermal decomposition temperature of 345° C. This compound shows a blue-green emission in its solid state. It has a PL emission peak at 440 in THF, a HOMO of −5.9 eV and a LUMO of −2.9 eV. This compound can be fabricated into an OLED using the above generalized procedure.

EXAMPLE 10

Referring again to the reference numerals of FIG. 1, an OLED according to the present invention was made by first cleaning a glass substrate 1 having an ITO anode 2 patterned thereon (ITO anode being 25 mm×74 mm×1 mm) in isopropyl alcohol for 5 minutes by using ultrasonic wave, followed by rinsing in deionized water for 5 minutes and in isopropyl again for 5 minutes. The cleaned ITO substrate was placed in a substrate holder of a vacuum deposition chamber and the pressure was reduced to $2 \times 10^{-2}$ Pa. A layer of NPB was heated and deposited as a hole injection layer 3 by vacuum deposition at a rate of 3 nm/sec to a thickness of 20 nm. A layer of $AlQ_3$ was deposited as emissive layer 4 by vacuum deposition at a rate of 3 nm/sec to a thickness of 40 nm. Compound (D), shown above, was deposited as electron transport layer 5 by vacuum deposition to a thickness of 20 nm. Finally, a bilayer cathode 6 was applied comprising a thin layer of LiF (0.8 nm) followed by Al (200 nm). A driving voltage was applied and a uniform light of green color was observed. The density of electric current produced by the device was 600 mA/cm² at 10 V.

EXAMPLE 11

An OLED device according to the invention was fabricated in the same manner as described in Example 10, except that Compound (F), shown above, was substituted for compound (D). The device emitted a green light when a forward bias was applied. The density of electric current produced by the device was 500 mA/cm² at 10 V.

COMPARATIVE EXAMPLE

An OLED device was fabricated in the same manner as described in Example 10, with the exception that one 60 nm layer of $AlQ_3$ was deposited in place of the $AlQ_3$ emissive layer 4 and the compound (D) electron transport layer 5. This layer acted as both the emissive layer and the electron transport layer. The device emitted a green light when a forward bias was applied. The density of electric current produced by the device was 300 mA/cm² at 10 V.

The foregoing examples are illustrative only and are not to be deemed limiting of the invention, which is defined by the following claims and is understood to include such obvious variations and modifications as would be obvious to those of ordinary skill in the art.

What is claimed is:

1. An organic light-emitting device comprising a functional layer sandwiched between an anode and a cathode, wherein said functional layer comprises a phenanthroline-fused phenazine based compound.

2. The organic light-emitting device according to claim 1, wherein the phenanthroline-fused phenazine based compound is of the following structure:

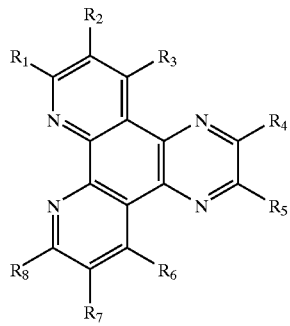

wherein $R_1$ to $R_8$ independently represent H, an alkyl group, an alkoxy group, or an aromatic group.

3. The organic light-emitting device according to claim 2, wherein the phenanthroline-fused phenazine based compound has the following structure:

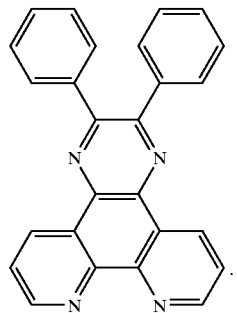

4. The organic light-emitting device according to claim 2, wherein the phenanthroline-fused phenazine based compound has the following structure:

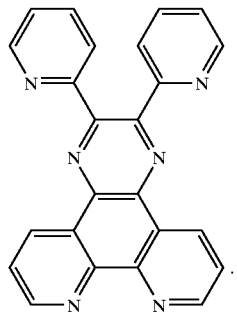

5. The organic light-emitting device according to claim 2, wherein the phenanthroline-fused phenazine based compound has the following structure:

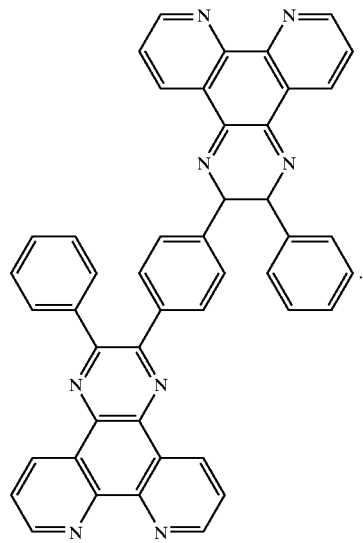

6. The organic light-emitting device according to claim 2, wherein the phenanthroline-fused phenazine based compound has the following structure:

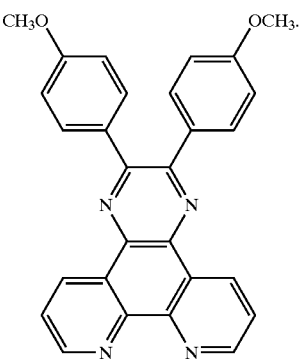

7. The organic light-emitting device according to claim 2, wherein the phenanthroline-fused phenazine based compound has the following structure:

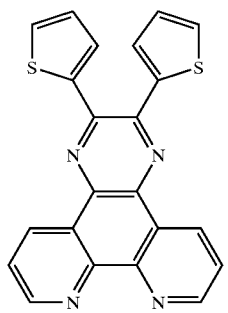

8. The organic light-emitting device according to claim 1, wherein the phenanthroline-fused phenazine based compound is of the following structure:

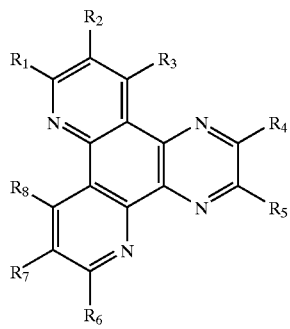

wherein R₁ to R₈ independently represent H, an alkyl group, an alkoxy group, or an aromatic group.

9. The organic light-emitting device according to claim 1, wherein the phenanthroline-fused phenazine based compound is of the following structure:

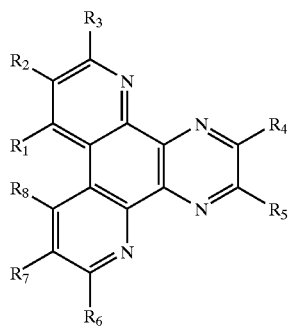

wherein R₁ to R₈ independently represent a hydrogen atom, an alkyl group, an alkoxy group, or an aromatic group.

10. The organic light-emitting device according to claim 1, wherein the phenanthroline-fused phenazine based compound is of the following structure:

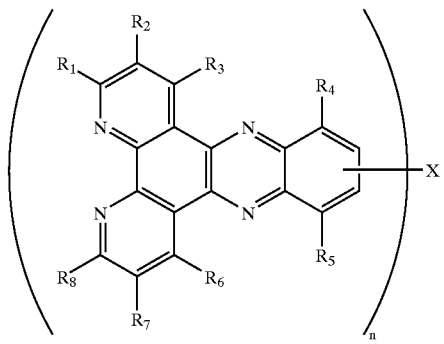

wherein R₁ to R₈ independently represent H, an alkyl group, an alkoxy group, or an aromatic group; X represents O, S, NR, with R being H or an alkyl group, CH₂, CH₂CH₂, or a fused or substituted aromatic group; and n is an integer from 1 to 12, wherein X may not be present when n is 1.

11. The organic light-emitting device according to claim 10, wherein the phenanthroline-fused phenazine based compound has the following structure:

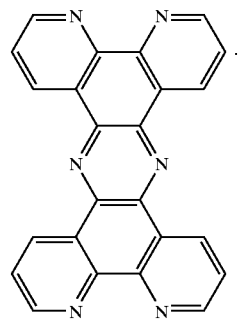

12. The organic light-emitting device according to claim 10, wherein the phenanthroline-fused phenazine based compound has the following structure:

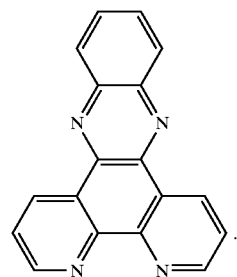

13. The organic light-emitting device according to claim 10, wherein the phenanthroline-fused phenazine based compound has the following structure:

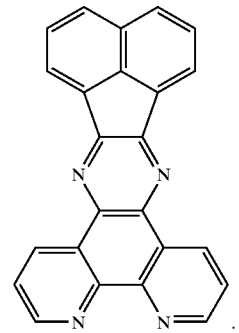

14. The organic light-emitting device according to claim 10, wherein the phenanthroline-fused phenazine based compound has the following structure:

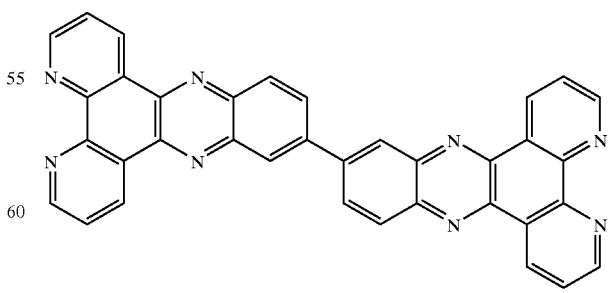

15. The organic light emitting device according to claim 10, wherein the phenanthroline-fused phenazine based compound has the following structure:

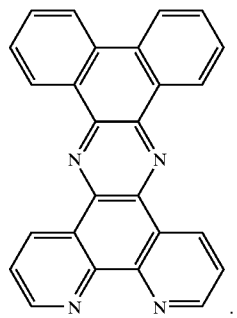

16. The organic light emitting device according to claim 10, wherein X is O, S, NR, CH$_2$, or CH$_2$CH$_2$ and n is 2.

17. The organic light emitting device according to claim 10, wherein the phenanthroline-fused phenazine based compound has the following structure:

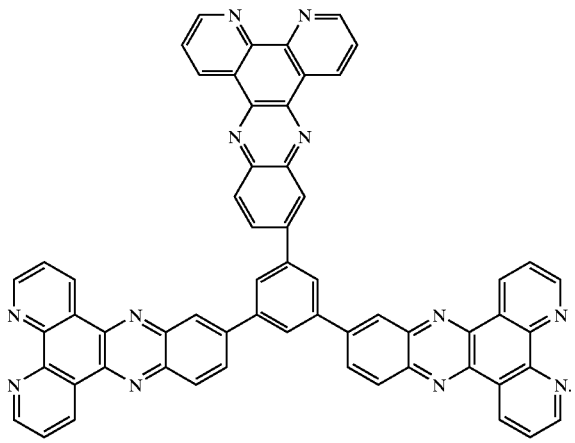

18. The organic light-emitting device according to claim 10, wherein the phenanthroline-fused phenazine based compound has the following structure:

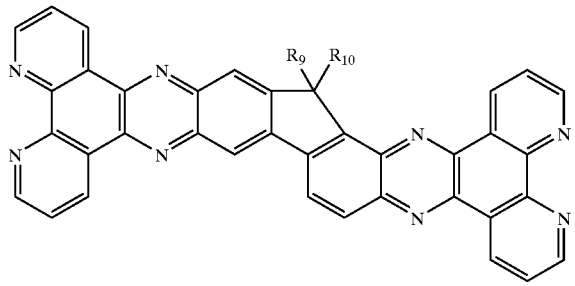

wherein R$_9$ and R$_{10}$ independently are H, CH$_3$ or another alkyl group.

19. The organic light-emitting device according to claim 1, wherein the phenanthroline-fused phenazine based compound is of the following structure:

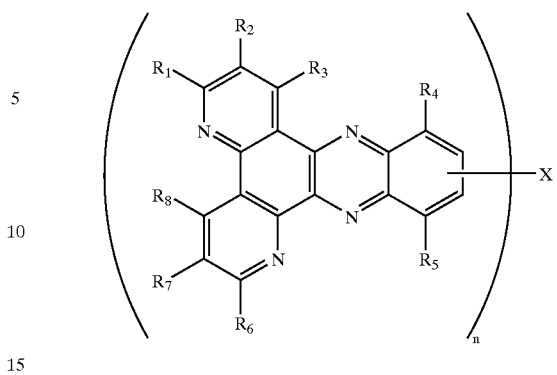

wherein R$_1$ to R$_8$ independently represent H, an alkyl group, an alkoxy group, or an aromatic group; X represents O, S, NR, with R being H or an alkyl group, CH$_2$, CH$_2$CH$_2$, or a fused or substituted aromatic group; and n is an integer from 1 to 12, wherein X may not be present when n is 1.

20. The organic light-emitting device according to claim 1, wherein the phenanthroline-fused phenazine based compound is of the following structure:

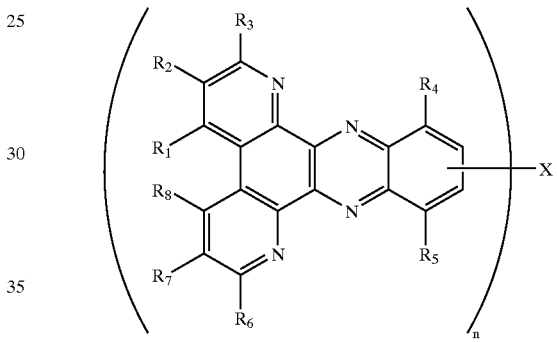

wherein R$_1$ to R$_8$ independently represent H, an alkyl group, an alkoxy group, or an aromatic group; X represents O, S, NR, with R being H or an alkyl group, CH$_2$, CH$_2$CH$_2$, or a fused or substituted aromatic group; and n is an integer from 1 to 12, wherein X may not be present when n is 1.

21. The organic light-emitting device according to claim 1, wherein said functional layer is an emissive layer.

22. The organic light-emitting device according to claim 1, wherein said functional layer is an electron transport layer.

23. The organic light-emitting device according to claim 1, wherein said functional layer is a hole-blocking layer.

24. The organic light-emitting device according to claim 1, wherein said functional layer is a guest-host system including a functional guest material and a host material comprising the phenanthroline-fused phenazine.

25. The organic light-emitting device according to claim 24, wherein said functional guest material is an emitter.

26. The organic light-emitting device according to claim 24, wherein said functional guest material is an electron transporter.

27. The organic light-emitting device according to claim 24, wherein said functional guest material is a hole blocker.

28. The organic light-emitting device according to claim 1, wherein the organic light-emitting device is electro-fluorescent.

29. The organic light-emitting device according to claim 1, wherein the organic light-emitting device is electro-phosphorescent.

* * * * *

UNITED STATES PATENT AND TRADEMARK OFFICE
CERTIFICATE OF CORRECTION

PATENT NO. : 6,713,781 B1
DATED : March 30, 2004
INVENTOR(S) : Jian Ping Chen et al.

It is certified that error appears in the above-identified patent and that said Letters Patent is hereby corrected as shown below:

Column 3,
Line 3, "phenanthroline" should read -- phenanthroline-fused phenazine --; and
Line 38, "CH2, CH2CH2" should read -- $CH_2$, $CH_2CH_2$ --.

Column 8,
Line 21, "1841-845." should read -- 1841-1845. --.

Signed and Sealed this

Fifth Day of April, 2005

JON W. DUDAS
*Director of the United States Patent and Trademark Office*